(12) United States Patent
Chan et al.

(10) Patent No.: US 7,985,621 B2
(45) Date of Patent: Jul. 26, 2011

(54) METHOD AND APPARATUS FOR MAKING SEMICONDUCTOR PACKAGES

(75) Inventors: Vincent K. Chan, Richmond Hill (CA); Neil McLellan, Toronto (CA); Roden Topacio, Markham (CA)

(73) Assignee: ATI Technologies ULC, Markham, Ontario (CA)

( * ) Notice: Subject to any disclaimer, the term of this patent is extended or adjusted under 35 U.S.C. 154(b) by 159 days.

(21) Appl. No.: 11/469,256

(22) Filed: Aug. 31, 2006

(65) Prior Publication Data

US 2008/0057625 A1   Mar. 6, 2008

(51) Int. Cl.
| | |
|---|---|
| H01L 21/00 | (2006.01) |
| H01L 23/34 | (2006.01) |
| H01L 23/48 | (2006.01) |
| H01L 23/52 | (2006.01) |
| H01L 23/40 | (2006.01) |

(52) U.S. Cl. ......... 438/108; 257/712; 257/734; 257/778
(58) Field of Classification Search ................... 438/108
See application file for complete search history.

(56) References Cited

U.S. PATENT DOCUMENTS

| | | |
|---|---|---|
| 4,812,191 A | 3/1989 | Ho et al. |
| 5,866,852 A | 2/1999 | Benz et al. |
| 5,949,137 A | 9/1999 | Domadia et al. |
| 6,124,637 A | 9/2000 | Freyman et al. |
| 6,191,360 B1 | 2/2001 | Tao et al. |
| 6,284,569 B1 | 9/2001 | Sheppard et al. |
| 6,338,985 B1 | 1/2002 | Greenwood |
| 6,342,434 B1 | 1/2002 | Miyamoto et al. |
| 6,576,073 B2 | 6/2003 | Hilton et al. |
| 6,780,733 B2 | 8/2004 | Chason et al. |
| 6,903,278 B2 | 6/2005 | Sathe |
| 6,924,168 B2 | 8/2005 | Tuttle |

(Continued)

FOREIGN PATENT DOCUMENTS

EP   1775768 A1   4/2007

(Continued)

OTHER PUBLICATIONS

International Search Report dated Jan. 31, 2008 for PCT Application No. PCT/US2007/077115 pp. 1-14.

(Continued)

*Primary Examiner* — Andy Huynh
*Assistant Examiner* — Valerie Brown
(74) *Attorney, Agent, or Firm* — Vedder Price P.C.

(57) ABSTRACT

A method of packaging a plurality of semiconductor chips comprises: providing a substrate panel having a first coefficient of thermal expansion (CTE); providing a carrier having a second CTE that is less than the first CTE; heating the substrate panel and the carrier to first and second elevated temperatures respectively; mounting the substrate panel at about the first elevated temperature to the carrier, the carrier being at said second elevated temperature, to provide a connection between the carrier and the substrate panel; and cooling the carrier and the substrate panel from the first and second elevated temperatures thereby putting the substrate panel into tension in at least one direction. A stiffener panel may be affixed to the substrate panel and heated to an elevated temperature and while the substrate panel is heated to an elevated temperature. A plurality of dies may be mounted and electrically connected to the substrate panel. Under-filling of the plurality of dies may occur with the stiffener panel affixed to the substrate panel.

36 Claims, 10 Drawing Sheets

U.S. PATENT DOCUMENTS

| | | |
|---|---|---|
| 6,949,404 B1 | 9/2005 | Fritz et al. |
| 6,956,291 B1 | 10/2005 | Li |
| 7,045,890 B2 | 5/2006 | Xie et al. |
| 2001/0052647 A1* | 12/2001 | Plepys et al. .................. 257/778 |
| 2003/0000736 A1* | 1/2003 | Sathe ............................ 174/255 |
| 2003/0045028 A1 | 3/2003 | Tsao et al. |
| 2003/0157810 A1 | 8/2003 | Honda |
| 2005/0001311 A1* | 1/2005 | Ho et al. ....................... 257/712 |
| 2005/0056942 A1 | 3/2005 | Pogge et al. |
| 2006/0226538 A1 | 10/2006 | Kawata |
| 2007/0096305 A1* | 5/2007 | Fuergut et al. ............... 257/734 |

FOREIGN PATENT DOCUMENTS

| | | | |
|---|---|---|---|
| JP | 2005302922 A | | 10/2005 |
| WO | WO/2005/086224 | * | 2/2005 |
| WO | WO 2005/119776 A1 | | 12/2005 |

OTHER PUBLICATIONS

IBM Corporation; Anti-Curl Backer Sheet for ACT IV Stiffener; IBM Technical Disclosure; vol. 34, No. 6; Nov. 1, 1991; pp. 340-341.

* cited by examiner

METHOD AND APPARATUS FOR MAKING SEMICONDUCTOR PACKAGES

FIELD OF THE INVENTION

The invention relates generally to electronics packaging, and more specifically to semiconductor chip packaging, including packages made with thin core and coreless substrates.

BACKGROUND OF THE INVENTION

One of the most significant challenges involved in the packaging of semiconductor chips is to avoid the warping of, and other damage to, the substrate during the packaging process.

As various industry sectors are seeking thinner and lighter semiconductor chips, the semiconductor manufacturing industry is moving towards the use of semiconductor packages formed of one or more integrated circuit dies, mounted on a thin core or coreless substrate.

However, as the thickness and/or density of the core are reduced, or as separate cores are eliminated entirely, the packaging and subsequent processing of the substrates becomes more difficult. This is principally because of the decreased strength and rigidity of the substrate and the resulting vulnerability during assembly and post assembly processes and handling. One problem is the warping of the substrate, particularly with thin core and coreless substrate packages, that can result during the manufacturing processes when, for example, dies and other components are attached to the substrate.

The various manufacturing steps may involve significant increases in the temperature of the substrate, which can cause warping. The warping of the substrate can cause die cracking and result in an inoperative semiconductor chip. Another problem related to substrate warping may be poor substrate co-planarity that may render the semiconductor chip package more difficult to interconnect with other devices.

The general use of stiffener rings to support or add rigidity to a substrate is known. Also, the use of heat spreaders that are secured to the substrate, to disperse heat during operation of the integrated circuit package, is also known. These components are typically mounted to the substrate by adhesive or solder. However, difficulties can arise in the mounting of these components. During mounting of the stiffener or heat spreader components, warping or other damage can occur to the substrate.

One particular process that may involve significantly increasing the temperature of the substrate and other elements of the package, and which may render the substrate particularly prone to warping, is the under-filling of the flip chip dies. Under-filling is used to compensate for differences in thermal expansion rates between the die and the substrate and to absorb physical shock stresses incurred during use of the package. The under-fill material may be an engineered epoxy. The under-fill may be flowed into the desired positions in the gaps between the die and the substrate. Once the under-fill is cured, the chip, under-fill, and substrate deform together as a unit to significantly limit the relative deformation between the chip and the substrate.

However, when applying the under-fill, which is typically an epoxy, the heat associated with this step may result in thermally generated stresses in the substrate that may tend to warp the substrate. This may result at least in part from the fact that the die may have a coefficient of thermal expansion (CTE) that is significantly lower than the CTE of the substrate. For example the CTE of the die may be about 5 ppm and the CTE of the substrate may be about 16 ppm. The substrate and die may expand during the die attachment process and during the under-fill process when the binding epoxy is applied to bind the die and substrate together. Both the die attach process and the under-fill process, are normally carried out with the die and substrate at elevated temperatures. Once the combination of substrate and die are cooled with the epoxy binding the substrate and die together, warping may result due to the different CTE's of the substrate and die.

In known methods of making semiconductor chip packages, particularly when the packages are made from thin core or core-less substrates are being made, the attachment of the stiffener ring is normally carried out after the under-fill process. This is usually to avoid stressing the die bumps and the connection between the die and the substrate, during the attachment of the stiffener ring (ie. the under-fill reduces the risk of any relative movement of the die and the substrate at the solder bump/pad connection when the stiffener ring is attached.) However, the result is that during the under-fill process, there may not be sufficient support for the substrate, to resist warping.

Typically, in the manufacturing of semiconductor chip package, a substrate panel is utilized which can form the substrate for multiple separate semiconductor chips. Components for multiple chips may be added at the same time to a larger substrate panel. After component mounting, the larger substrate panel and components combination can be singulated (i.e. separated) into multiple individual semiconductor chip packages.

However, mounting components for multiple semiconductor chips to a single substrate panel will increase the aforementioned problems of handling and processing. Additionally, the overall size of the substrate panel can increase the stresses, at least in certain parts of the panel, during handling and processing.

Accordingly, an improved packaging process for semiconductor chips, particularly those having thin core or coreless substrates, is desirable.

SUMMARY OF THE INVENTION

According to one aspect of the invention there is provided a method of packaging a plurality of semiconductor chips comprising: providing a substrate panel having a first coefficient of thermal expansion (CTE); providing a carrier having a second CTE that is less than the first CTE; heating the substrate panel and the carrier to first and second elevated temperatures respectively; mounting the substrate panel at about the first elevated temperature to the carrier, the carrier being at the second elevated temperature, to provide a connection between the carrier and the substrate panel; and cooling the carrier and the substrate panel from the first and second elevated temperatures thereby putting the substrate panel into tension in at least one direction.

According to another aspect of the invention there is provided a method of packaging a plurality of semiconductor chip comprising: providing a substrate panel; supporting the substrate panel with a substantially rigid carrier from beneath the substrate panel; affixing a stiffener panel to the substrate panel when the stiffener panel is heated to a first elevated temperature and the substrate panel is heated to a second elevated temperature, such that the substrate panel is positioned between the carrier and the stiffener panel; mounting and electrically connecting a plurality of dies to the substrate panel; and under-filling the plurality of dies with the stiffener panel affixed to the substrate panel.

According to another aspect of the invention there is provided a method of packaging a plurality of semiconductor chips comprising: providing a substrate panel having a first coefficient of thermal expansion (CTE); providing a stiffener panel comprising a plurality of stiffeners, the stiffener panel having a second CTE that is less than the first CTE; affixing the stiffener panel to the substrate panel when the stiffener panel is at a first elevated temperature and the substrate panel is at a second elevated temperature; cooling the substrate panel and the stiffener panel from the second and first elevated temperatures respectively, to place the substrate panel in tension in at least one direction; and singulating the substrate panel and the stiffener panel into a plurality of semiconductor chip packages.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
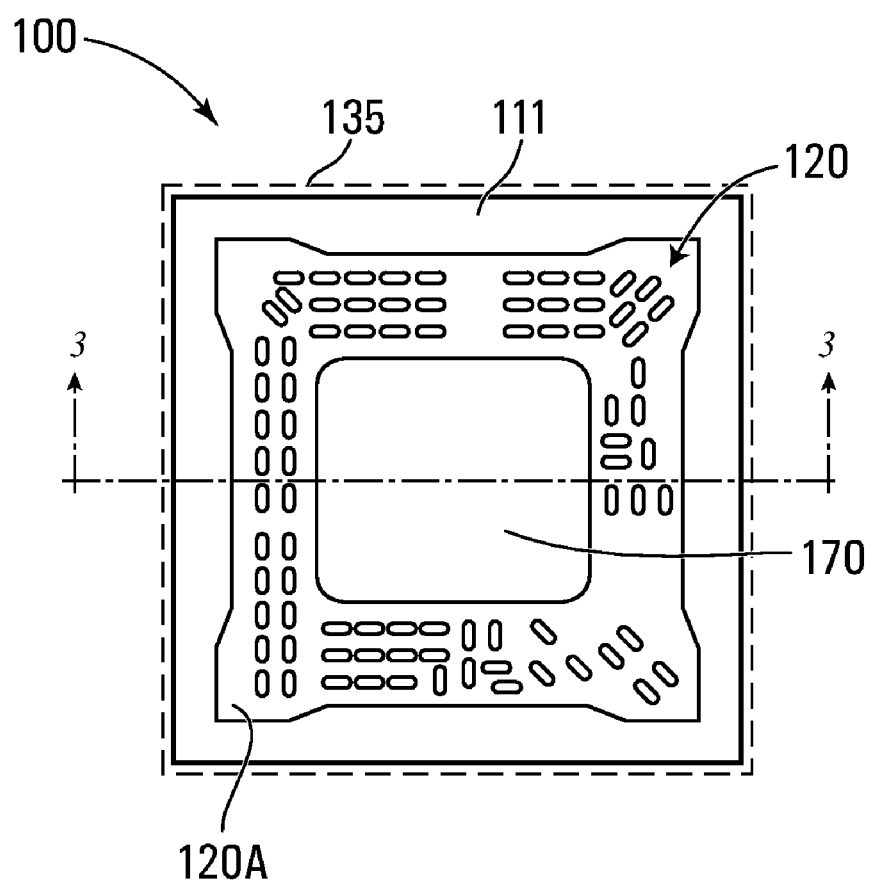
FIG. 1 is a plan view of an example of a semiconductor chip package with a thin core that can be made using the methods and apparatus exemplary of embodiments of the present invention.
Figure 2:
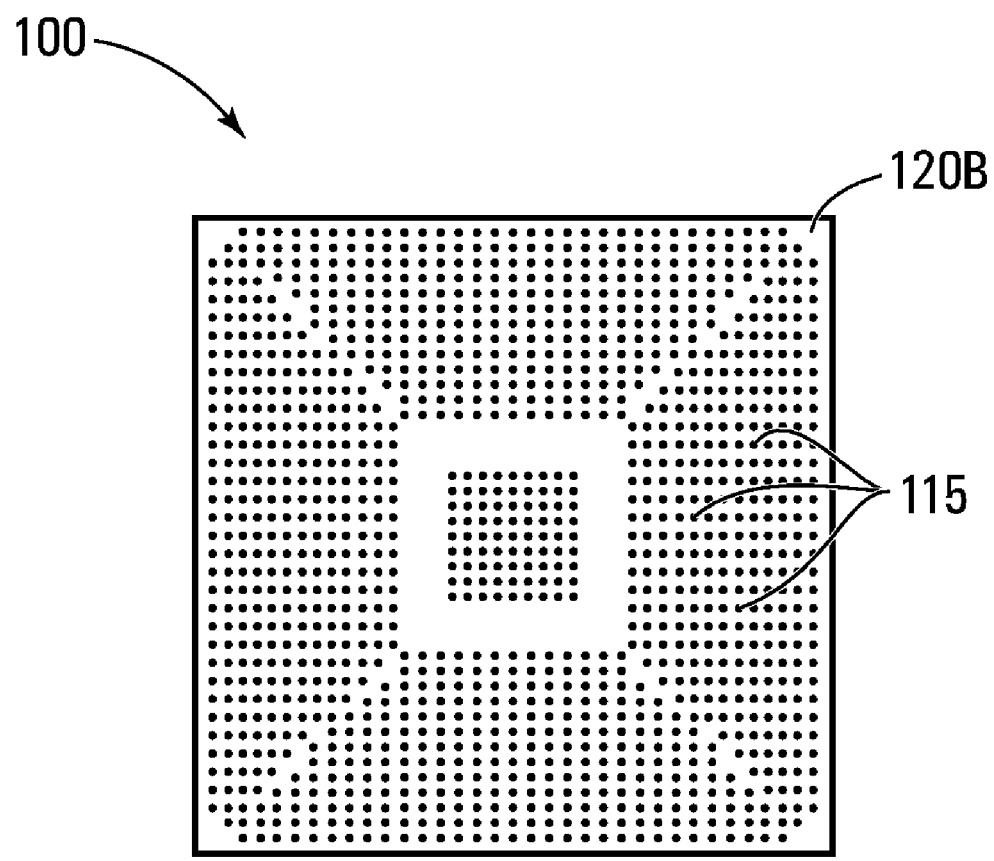
FIG. 2 is a bottom plan view of the semiconductor chip package of FIG. 1.
Figure 3:
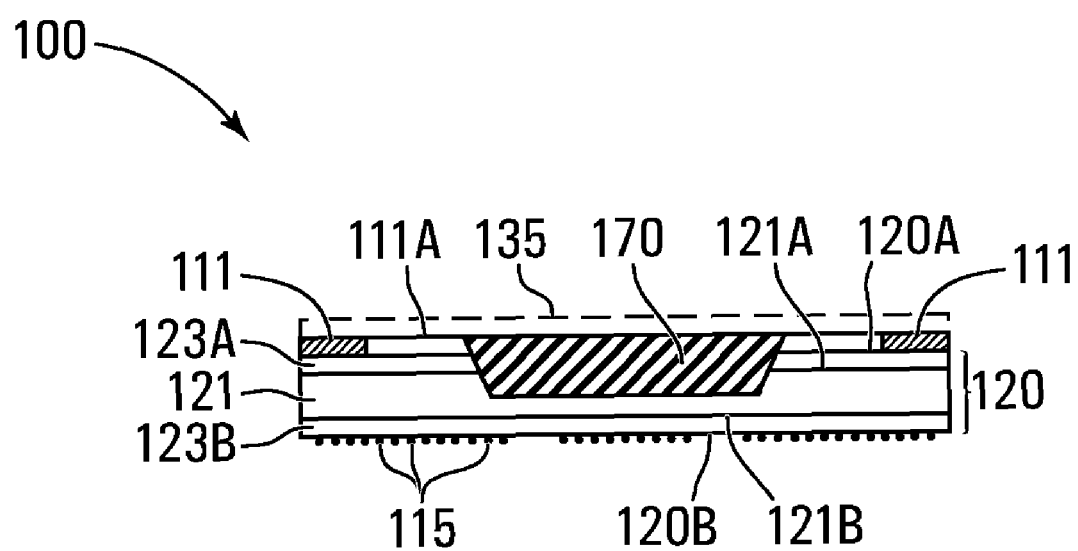
FIG. 3 is a cross-sectional view at 3-3 in FIG. 1.

FIGS. 1, 2 and 3, illustrate a flip chip ball grid array (FC-BGA) semiconductor chip package 100. Semiconductor chip package 100 includes a substrate 120 that has an upper die side surface 120a and a lower device attach surface 120b. Substrate may have a thin core 121. Thin core 121 may be made from any suitable material known to persons skilled in the art, including a suitable polyimide resin, polyimide alloys, non-alloy polymer such as BT epoxy, metal composites, ceramic or glass composites, or similar composites, or other suitable materials or combinations of materials.

As shown in FIG. 3, core 121 may have a depth in the range of about 700 μm to about 900 μm. Core 121 may be a thin core substrate thin core 121 may have a thickness of about 0.1 to 0.5 mm. and may be in the range of about zero to 0.10 mm. It will, however, be appreciated that in some substrates, the core thickness will be greater or less than these ranges, and in other substrates, no core at all may be provided.

Core 121 has an upper side surface 121a and lower side surface 121b. Core 121 may have bonded or otherwise attached on one or both surfaces 121a, 121b, one or more electrically conductive layers 123 which typically are made of multi-laminate material or materials. Multi-laminate layers 123 may be made from thin layers of copper and may also include additional dielectric layers that may be formed or placed on top of the copper layers. In a thin core substrate, multi-laminate layers 123 may in total have a thickness, on each surface of thin core surface 121 in the range of from about 10 μm to about 25 μm in typical thickness.

In a coreless substrate, the multi-laminate layers (one set on the die side, the other set on the solder ball side) may have a total combined thickness in the order of about 130 μm.

A semiconductor die 170, including one or more active semiconductors circuits, may be secured on the upper die side surface of substrate 120, in an inverted configuration through interconnection and attachment of the solder balls on the die with corresponding pads on the die side surface 121a of substrate 121, with techniques known to those skilled in the art.

As further shown in FIG. 2, a grid array of solder balls 115 on the lower side surface 120b of substrate 120, may electrically interconnect package 100 to other devices, in use, in manners known to persons skilled in the art.

To promote the rigidity of package 100, a stiffener ring 111 may further be secured to substrate 120, such as being affixed directly to the substrate with a suitable adhesive provided in a layer between mating surfaces. Ring 11, extends along the periphery of substrate 120. Ring 111 may be secured to either or both sides of the substrate 120; in package 100 illustrated in FIGS. 1, 2 and 3, stiffener ring 111 is attached on the die side surface 120a of the substrate 120.

Stiffener ring 111 may be made from any suitable material known to those skilled in the art including stainless steel, carbon steel, FR5, FR4, copper, aluminum, etc. Various configurations of stiffener rings 111 can also be employed, as is known to those skilled in the art.

In addition to stiffener ring 111 that is primarily used to promote rigidity of package 100, a separate heat spreader 135 (shown only in broken lines in FIGS. 1 and 3) may also, or alternatively, be provided. Heat spreader 135 may, for example, be formed as a piece of flat, rigid, thermally conductive metal, such as nickel plated copper and be about 0.5 mm to about 0.7 mm in thickness. Heat spreader 135 may be secured to become part of package 100 by use of a thermally conductive adhesive layer to affix surfaces of the heat spreader to mating surfaces of stiffener ring 111, in a manner known to persons skilled in the art. Heat spreader 135 may add additional thickness and/or weight to the overall package 100. Heat spreader 135 may be in direct contact with the upper surface of die 170 and thus conduct heat away from the die 170. As an alternative, a heat spreader may be integrally formed as part of, or in conjunction with the stiffener ring 111 so that one structure or member promotes rigidity and dispersing heat.

While in FIGS. 1, 2 and 3, a FC-BGA package is illustrated, the methods and apparatuses of the present invention may be used in manufacturing other semiconductor chip packages including Flip Chip Pin Grid Array packages, wire bond packages, other array application with or without BGA balls and other types of packages incorporating thin core or coreless substrates.

Methods of packaging a semiconductor chip with a substrate having a core, including methods for packaging a chip with a thin core or coreless substrate, in manner exemplary of embodiments of the present invention, are hereinafter disclosed.

Figure 4A:
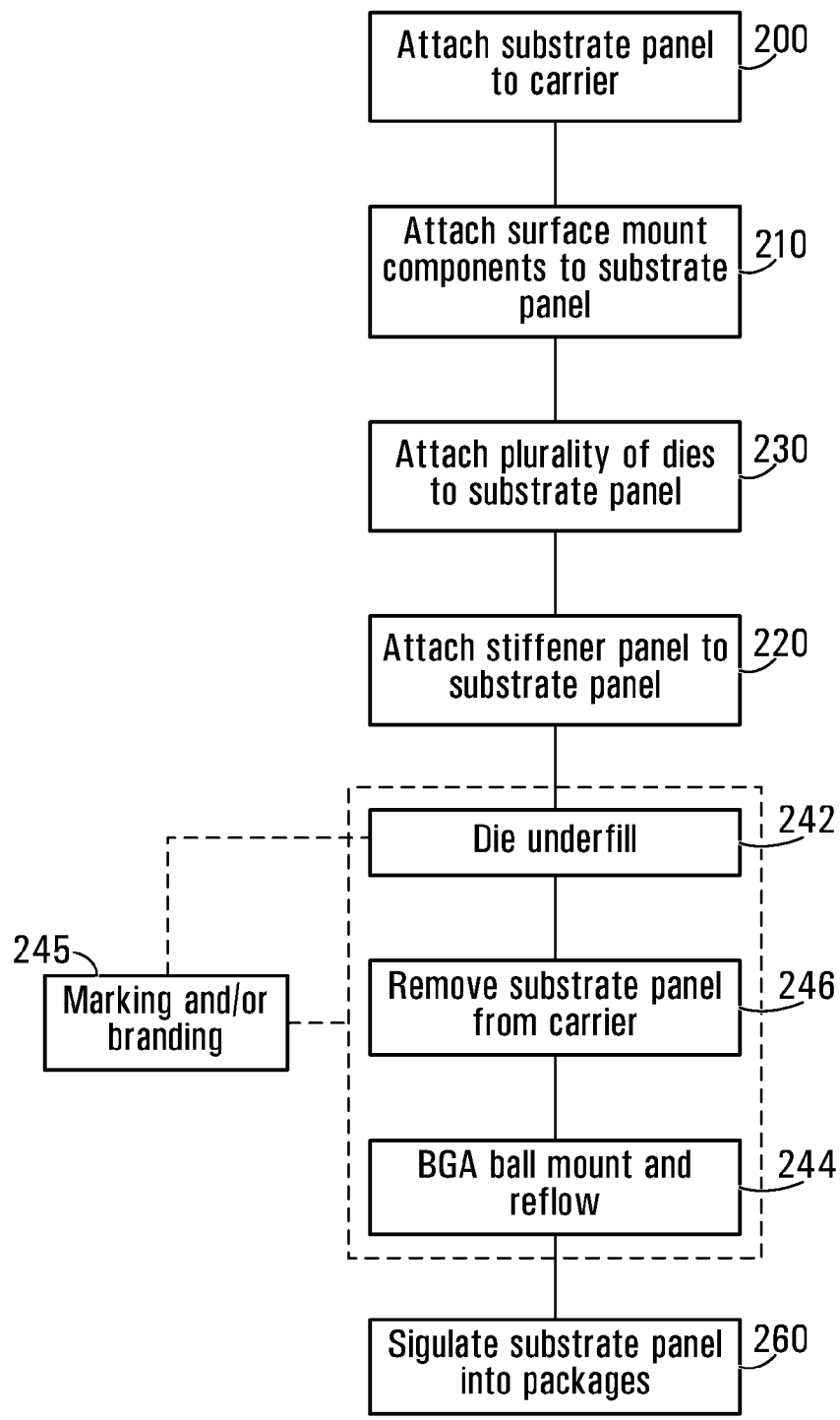
FIG. 4a is a flow diagram of steps of a process for making a semiconductor chip package with a thin core or coreless substrate, in manners exemplary of embodiments of the present invention.
Figure 4B:
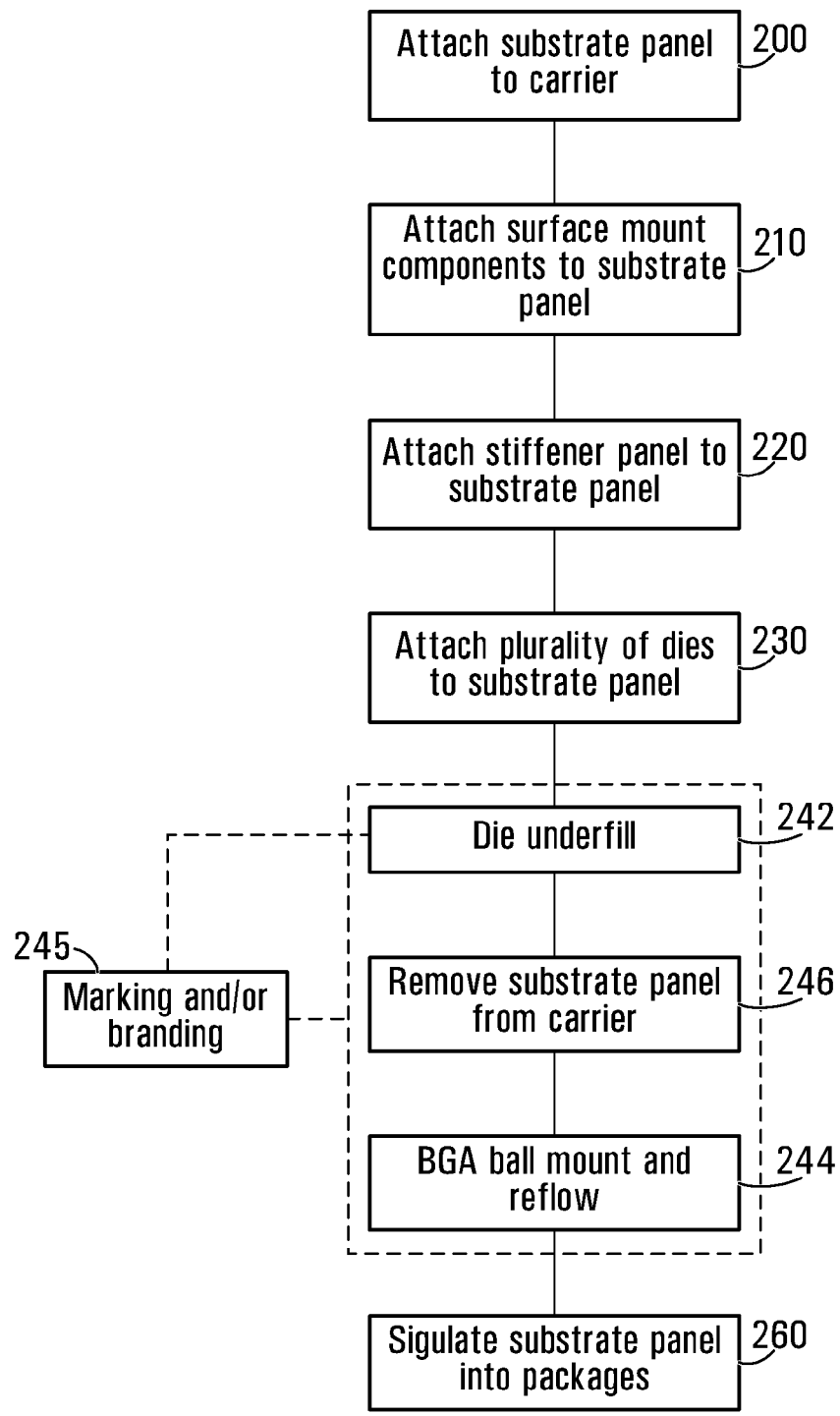
FIG. 4b is a flow diagram of steps of an alternate process for making a semiconductor chip package with a thin core or coreless substrate, in manners exemplary of embodiments of the present invention.
Figure 7:
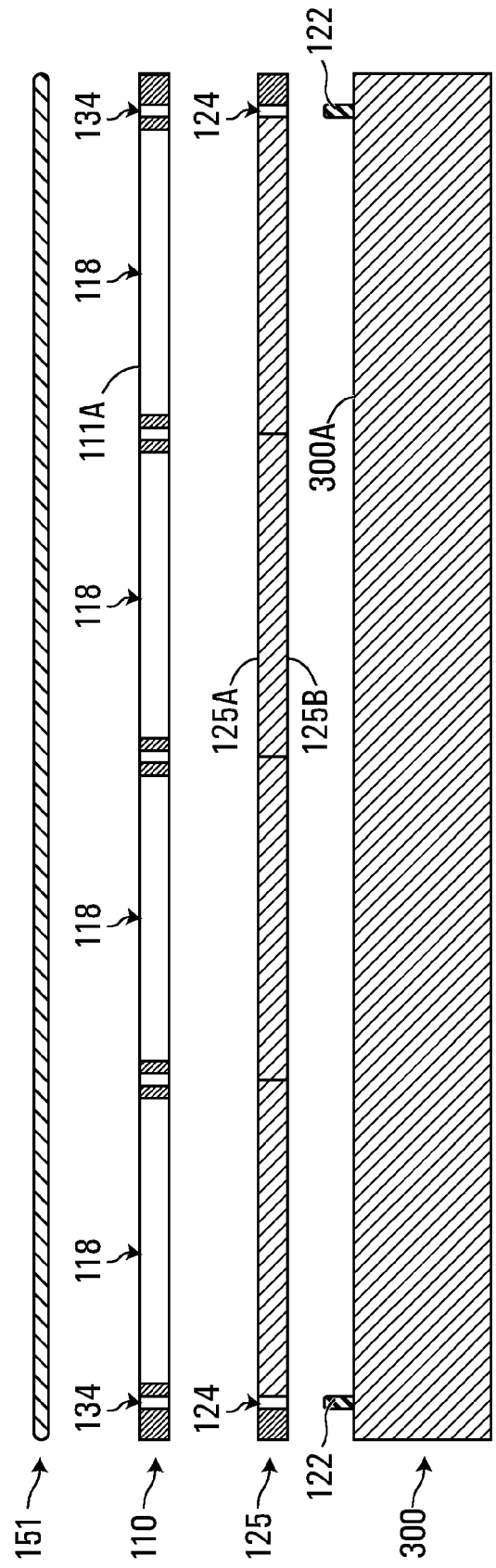
FIG. 7 is an exploded cross sectional view similar to FIG. 8, of the carrier, substrate panel, stiffener panel and optional heat spreader.
Figure 8:
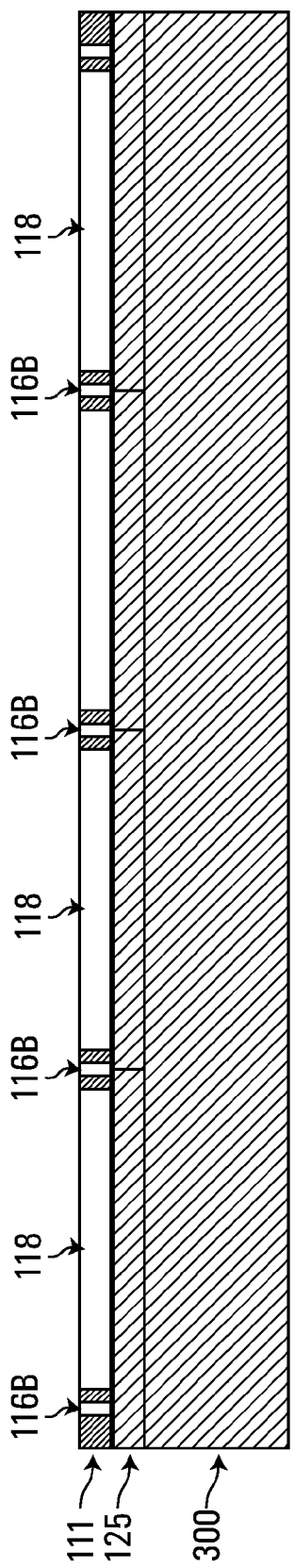
FIG. 8 is a cross sectional view at 8-8 in FIG. 5 of the carrier, with a substrate panel and stiffener panel mounted on the carrier.

Specifically, basic components that may be used in exemplary methods to a form semiconductor package 100 are illustrated in FIG. 7. Steps of two exemplary methods are shown in FIGS. 4a and 4b. As illustrated in FIG. 7, components that may be used in the methods include a carrier 300, a substrate panel 125, a stiffener panel 110, and optionally a heat spreader panel 151.

In this document: the term "substrate panel" refers to an elongated relatively flat and thin piece of material which is suitable, once singulated, to provide a substrate for each of a plurality of semiconductor chip packages; the term "stiffener panel" refers to an elongated piece of material which is suitable, once singulated, to provide a stiffener for each of a plurality of semiconductor chip packages; and the term "heat spreader panel" refers to an elongated piece of material which is suitable, once singulated, to provide a heat spreader for each of a plurality of semiconductor chip packages.

In general overview, a method of forming a semiconductor chip package such as for example, package 100 may use a carrier 300 to which may be mounted a substrate panel 125, during assembly. Substrate panel 125 may comprise a panel of material, larger than an individual semiconductor chip package 100, configured in an array of separate areas that can be singulated into individual substrates 120 for a plurality of separate packages each having the form of package 100. By way of example only, substrate panel 125 may have dimensions of a width and length selected in the range of about 16 cm to about 60 cm.

With substrate panel 125 secured to and supported by a carrier 300, and prior to singulation, components (not shown in FIG. 7) for a multiple of packages like package 100 may be mounted to the substrate panel 125 with a reduced risk of compromise of the array of packages 100. Substrate panel may be mounted to carrier 300 in such a way as to put the substrate panel into tension when on the carrier.

Also, methods may use an elongated stiffener panel 110 that will form a plurality of separate stiffener rings 111, and thus may provide a stiffener 111 (FIGS. 1 and 3) for each of a plurality of packages, like package 100. Stiffener panel 110 may be mounted to substrate panel 125 to enhance its overall strength and rigidity and resistance to warping, and to protect the individual substrates 120 formed from substrate panel 125.

At the same time, heating and cooling of the substrate panel 125 and any components attached thereto may occur while the substrate panel 125 is supported on carrier 300.

As will be described in detail hereinafter, through choice of materials having suitable coefficients of thermal expansion (CTEs), the substrate panel 125 may be placed into tension in one or both longitudinal and transverse directions relative to stiffener panel 110 and/or to carrier 300. As an aside, it should be noted that the CTE of a particular component may not be consistent throughout, such as for example, if the component is not made uniformly throughout from the same material. However, in this document, when a "CTE" is referred to in relation to a component, this may be taken to mean the average CTE of that component.

The resulting semiconductor chip packages 100 produced with these methods may thus be provided with greater structural strength.

Specifically, with reference to both FIGS. 4A and 4B, in step 200, a substrate panel 125, which may be a core-less or thin core substrate panel, may be attached to support carrier 300. This step may be carried out at an elevated temperature, such as for example in the range of about 60 to about 80 degrees celsius and which may be about 60 degrees celsius. The heating of both carrier 300 and substrate panel 125 may be carried out using a heated mounting block in an automatic mounting and substrate panel 125 may be placed onto the upper surface of carrier 300 using loading equipment. Substrate panel 125 and carrier 300 may be heated to substantially the same elevated temperatures or to two different temperatures if overall a tension force exerted on substrate panel 125 results.

In step 210, which in the methods of both FIGS. 4a and 4b, occurs prior to mounting of the dies 170 or stiffener panel 110, passive components (not shown) such as for example, surface mount capacitors, coils and resistors may be mounted to substrate panel 125. This step may typically not be done at an elevated temperature, although some of the component mounting processes may create localized increases in temperature. However, these processes may not create sufficient heating to warp substrate panel 125.

In step 220, which may occur prior to attaching dies 170 (FIG. 4B) or after attaching dies 170 (FIG. 4A), stiffener panel 110 may be attached to the upper surface of substrate panel 125. As described below in more detail, step 220 may involve the use of epoxy or other thermosetting plastics or adhesives, and thus occur at one or more elevated temperatures such as about 160 degrees celsius.

The heating of carrier 300, substrate panel 125 and stiffener panel 110 may be carried out using automatic loading equipment with heating blocks or heated ambient and the stiffener panel 110 may be placed onto the upper surface of carrier 300 using automatic loading equipment with heated environment or heating blocks. The type of equipment that may be used to apply the epoxy to the stiffener panel 110 and/or the substrate panel 125, prior to joining the together includes equipment with heated block and pressure application to cure the glue at high temperature at about 150 C.

Optionally, in step 225, heat spreader panel 150 providing heat spreaders for a plurality of substrates 120 may be also added to substrate panel 125. Steps 210, 220, and 225 may occur in that sequence, take place together, partially overlapped, or take place in any other sequence.

In step 230, a plurality of dies 170 may be attached to substrate panel 125. Typically, the solder provided on dies 170 is reflowed, through the addition of heat with a reflow furnace that may involve temperatures in the range of about 240 to about 250 degrees celsius and may be about 240 degrees celsius.

In step 242, "under-filling" as referred to herein, and which may include die under-filling, mold under-filling and similar encapsulation processes, may be provided in a manner known to those skilled in the art.

Conveniently, the attachment of stiffener panel 110 in step 220 may be carried out in the methods disclosed in both FIG. 4A and FIG. 4B, prior to the die under-fill process 242. Carrier 300 may provide sufficient rigidity for substrate panel 125 during the under-filling. This is particularly the case with methods like the method of FIG. 4A, where stiffener panel 110 is attached to substrate panel 125 after the die attachment procedure in step 230, but prior to the under-fill process in step 242. The carrier 300 will provide sufficient rigidity to substrate panel 125, such that the connection between the dies 170 and substrate panel 125 may not be overly stressed and deflected during the attachment of the stiffener panel, even though under-filling has not occurred yet.

In methods like the methods of FIGS. 4A and 4B, when the under-fill process takes place in step 242, substrate panel 125 is sandwiched between both stiffener panel 110 and carrier 300, both of which may exert tensile forces on the upper and lower surfaces respectively of substrate panel 125.

During under-fill process of step 242, carrier 300, substrate panel 125 and stiffener panel 110 may be heated to in the range of about 100 to about 120 degrees celsius to allow the under-fill material, which may be an epoxy, to migrate into position and then cure, bonding together the dies and the substrate.

After step 242, substrate panel 125 may be removed from carrier 300, which may be performed at an elevated temperature(s). The temperature(s) may be about the same at which the substrate panel 125 was initially attached to carrier 300 in step 200.

Once removed from carrier 300, the orientation of substrate panel 125 may be reversed prior to step 244. Then, in step 244, the solder balls 115 that form the solder ball grid array for each of the packages 100, may be attached to the solder ball side of the substrate panel 125.

In step 245, substrate panel 125 is branded and/or otherwise marked at a plurality of locations on the substrate panel, also in a manner known to those skilled in the art. In this way, after singulation/separation into separate packages 100, each package 100 may have separate branding and/or marking. Step 245 may in some example embodiments, be carried out at any convenient time after die attachment and prior to singulation.

Finally, in step 260, substrate panel 125 may be singulated (ie. divided up) and separated into a plurality of separate packages 100. This can be effected by cutting the combined substrate panel 125 and stiffener panel 110 with a saw, laser cutting device, or similar device.

Conveniently, carrier 300 provides support as passive components and die 170 are attached to substrate panel 125.

Figure 5:
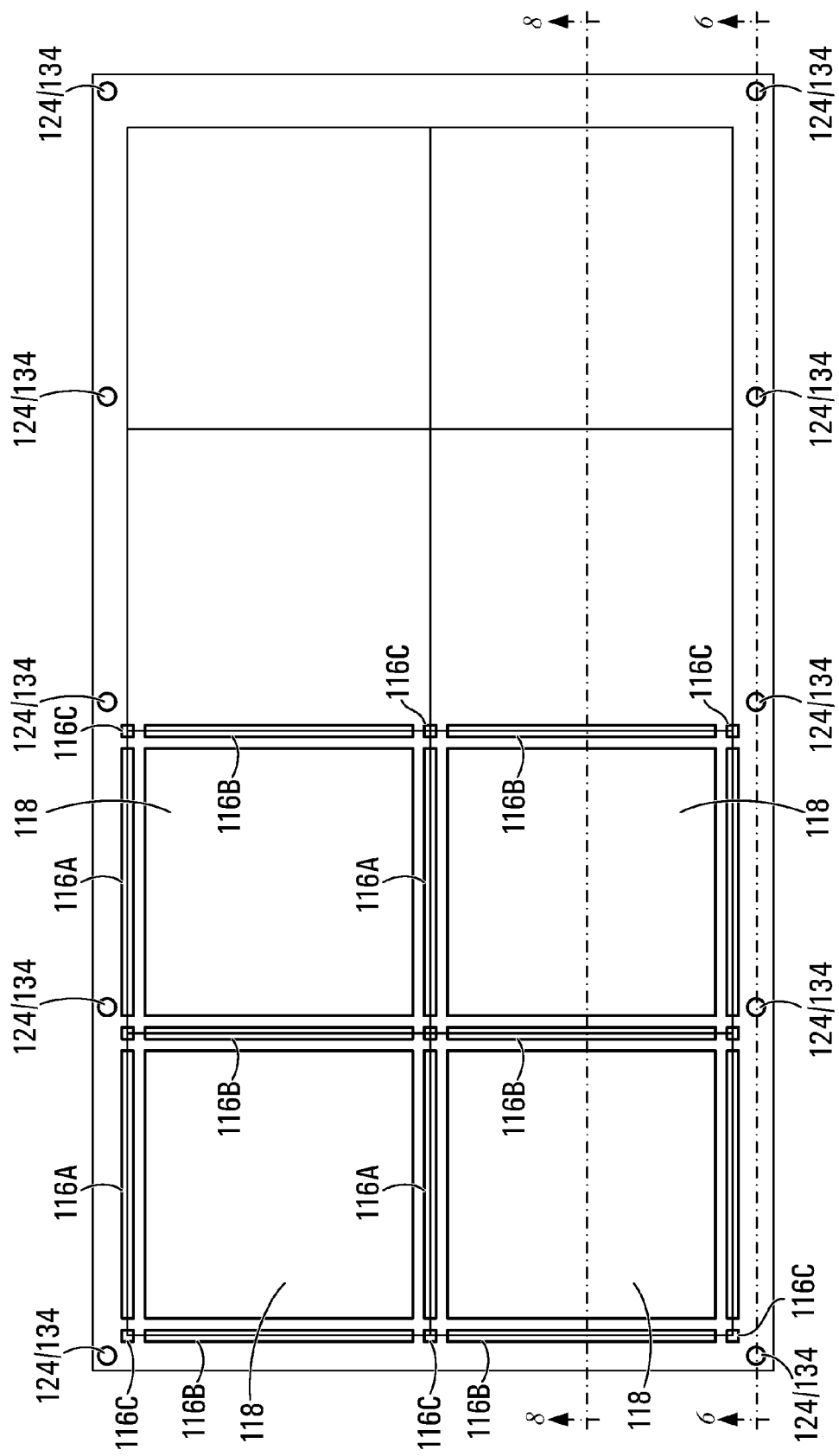
FIG. 5 is a plan view of a carrier, substrate panel and stiffener panel, with the stiffener panel only shown in part.

FIGS. 5, 6 and 7 further illustrate use of carrier 300. Carrier 300 may be a continuous sheet or plate made of a material or materials having a rectangular solid profile cross section in both longitudinal and transverse cross sections (see for example in FIG. 7). Carrier 300 may be selected such that it is suitable to provide support and rigidity over the entire bottom surface substrate panel 125 throughout the processing of the substrate panel into a plurality of semiconductor chip packages, like package 100.

Example suitable materials for carrier 300 include fiberglass based or type products such as FR4, and other suitable materials or combinations of materials. Carrier 300 can be of any suitable thickness. As carrier 300 does not become part of package 100, can have an arbitrary but suitable thickness. For example, carrier 300 made of FR4 may have a thickness in the range of about 1-2 cm. Of course, the thickness, width or length of carrier 300 may not be uniform. Carrier 300 similarly may not have a uniform transverse cross section and furthermore the transverse cross sections may not be rectangular in shape, or solid in cross sectional profiles.

Carrier 300 may in some alternate embodiments have a limited number of apertures (not shown) spaced along its length. Additionally, carrier 300 does not have to be configured as a flat rectangular plate. Other configurations are possible, but carrier 300 should provide adequate support beneath the entire bottom surface area of substrate panel 125. The configuration of carrier 300 may closely conform to the shape of the substrate which it is supporting, and may have an outer perimeter which extends to, or a small distance beyond, the outer perimeter of the substrate panel 125.

An upper surface 300a of carrier 300 may be planar and thus provide a flat base upon which to support the lower surface 125b of substrate panel 125.

Conveniently, carrier 300 may provide support that allows panel 125 to be moved through a semiconductor package manufacturing line. Carrier 300 may be moved along a path by any combination of robots, conveyors and the like. The handling of components that are mounted to substrate panel 125 may be performed by robots.

Carrier 300 may be moved through the package assembly procedure as described below in one or more orientations. For example, carrier 300 may be oriented substantially horizontal through part, substantially all, or all, of the path through the manufacturing line. Specifically, carrier 300 may be moved by one or more movement devices so that the substrate panel 125 can be mounted thereto. Substrate 125 may be appropriately aligned and moved toward and relative to the upper surface of carrier 300 so that a lower surface 125b of substrate panel 125 may lie flat on upper surface 300a of carrier 300. In other embodiments, carrier 300 may also or alternatively move towards the substrate panel 125.

To accomplish proper alignment of carrier 300 and substrate panel 125, upstanding alignment protrusions which may be configured as pins 122 of carrier 300 may be inserted into corresponding slots, which may be apertures 124, formed in substrate panel 125. Use of apertures 124 and alignment pins 122 is only an example of how the substrate panel 125 may be releasably secured to carrier 300 to form a releasable mechanical connection. By way of example only, other connection mechanisms include clamps.

However, the connection mechanism may allow for some amount of transverse and/or longitudinal contraction of the substrate panel 125, for reasons that will be described hereafter.

Conveniently, carrier 300 may be made from a material with a coefficient of thermal expansion (CTE) that is close in magnitude to the CTE of the material from which stiffener panel 110 is made. For example, carrier 300 made from FR4 and may have a CTE in the range of about 14-16 ppm, whereas stiffener panel 110 made from carbon steel may have a CTE of about 14 ppm.

The material of carrier 300 and stiffener panel 110 may be chosen so that their respective CTEs have a ratio of the carrier CTE to the stiffener panel CTE (the "Carrier/Stiffener CTE ratio") that is in the range of about 1.0 to about 1.1

The materials may be chosen such that the Carrier/Stiffener CTE ratio is substantially equal to one and thus will in the operating temperatures contract and expand the same amount when subject to changes in temperature.

Substrate panel 125 may be made of a material that has a CTE in the range of about 15 ppm to about 17 ppm being chosen so that it is significantly greater than the CTE of carrier 300 and/or stiffener panel 110.

Substrate panel 125 and carrier 300 may be chosen so that their respective CTEs have a ratio of the substrate CTE to the carrier CTE (the "Substrate/Carrier CTE ratio") that is in the range of about 1 to about 1.1

Substrate panel 125 may thus be mounted to carrier 300 in step 200 at an elevated temperature such as in the range of about 60 to about 90 degrees celsius) and may be about 60 degrees celsius. When the combination of carrier 300 and substrate panel 125 cools, substrate panel 125 will be put into and held in tension. The cooling of carrier 300 and substrate panel 125 may occur simply as a result of subjecting the combination to a relatively cool room/ambient temperature. This tensile force is due to the positioning of pins 122 on carrier 300 in apertures 124 of substrate panel 125, that engage inner surfaces of the substrate panel 125 at apertures 124, and due to the tendency of the substrate panel 125 to attempt to contract a greater amount than carrier 300. Depending upon the configuration of the apertures 124 and pins 122 the tension created in substrate panel can be in one or more directions (such as both longitudinally and transversely).

Figures 6A, 6B:
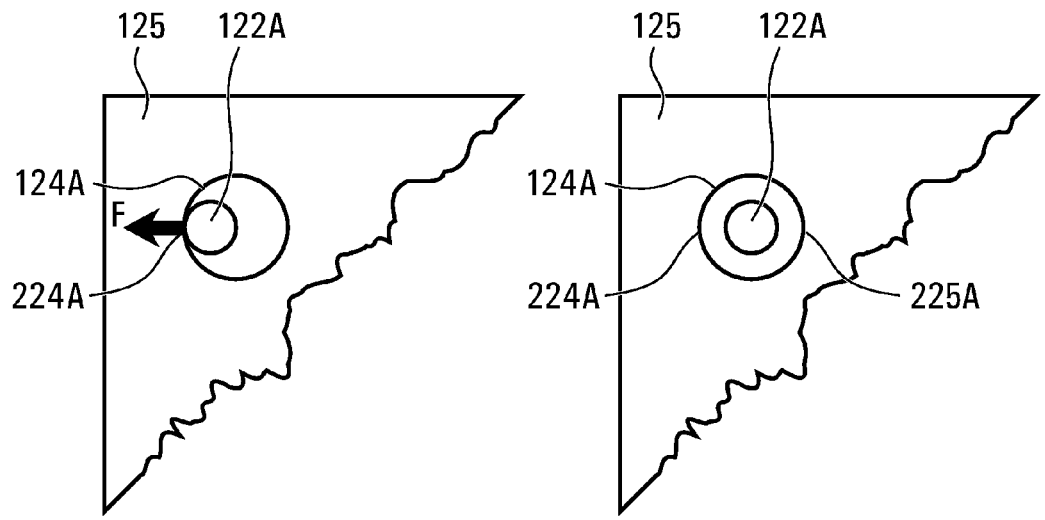
FIGS. 6a-d are enlarged schematic plan views at 6 in FIG. 5, illustrating in detail the interconnection of a pin of a carrier into an opening in a substrate panel.

With reference to FIGS. 6A and 6B, a pin 122a is shown in FIG. 6B in a substrate panel mounting position in relation to substrate panel 125. As can be seen in FIG. 6B, pin 122a will be received through the aperture 124a when substrate panel 125a and carrier 300 are at elevated temperatures. When substrate panel 125a and carrier 300 cool, substrate panel 125a which may wish to contract more than carrier 300, may engage surface portion 224a on the interior of aperture 124a as shown in FIG. 6a. Thus, the force F exerted on substrate panel 125a may put the substrate panel 125a into tension. It will be noted, that should the carrier 300 and substrate panel 125a be heated above the temperatures associated with FIG. 6B, substrate panel 125a will have relatively little ability to expand before pin 122a will engage opposite surface portion 225a, which may put the substrate panel 125a into compression, which is undesirable and may result in warping and/or buckling of substrate panel 125.

Figures 6C, 6D:
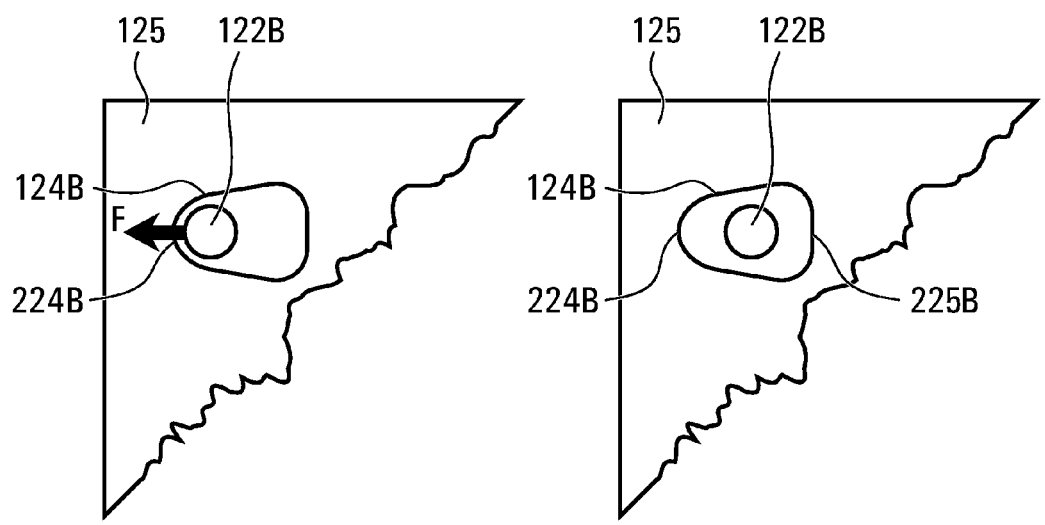

With reference to FIGS. 6C and 6D, a pin 122b that may be like pin 122a, is shown in FIG. 6B in a substrate panel mounting position in relation to substrate panel 125b. As can be seen, the pin 122a will be received through the aperture 124b during heating of the substrate panel 125b and carrier 300. Aperture 124b may be configured differently than aperture 124a. When the substrate panel 125b and carrier 300 cool, the substrate panel 125 which may wish to contract more than the carrier will engage surface portion 224b on the interior of aperture 124b as shown in FIG. 6C. Thus, the force F exerted on substrate panel 125b will put the substrate panel into tension. It will be noted, that should the carrier 300 and substrate panel 125b be heated above the temperatures associated with FIG. 6d, substrate panel 125a, will have relatively room to expand before pin 122a will engage opposite surface portion 225b, and thus may avoid putting substrate panel 125a into compression.

Various other configurations of protrusions and apertures are possible to achieve the functionality illustrated in FIGS. 6c and 6d.

Returning again to the methods illustrated in FIGS. 4a and 4b, after substrate panel 125 has been attached to the carrier 300, carrier 300 may be moved with substrate panel 125 so that various types of components may be attached to the substrate panel 125. Such additional components may be surface mount components, which may be passive devices such as resistors, capacitors, or inductors. The components may also include active devices such as discrete transistors where desirable for a particular application.

The attachment of surface mount components prior to the attachment of the stiffener panel 110 and possibly a separate heat spreader panel 110 may be advantageous. The available substrate top surface area 125a available for the attachment of surface mount devices may be increased and may provide increased flexibility in the design of the stiffener ring assembly 10. The carrier 300 may provide sufficient rigidity to overcome the disadvantages of a thin core or coreless substrate and allow for the attachment of the surface mount or other components prior to the attachment of the stiffener panel 110. Components can be mounted to substrate panel 125 to provide components for multiple packages 100. Techniques and equipment known to those skilled in the art can be used to carry out such component mounting. Heat may for example be generated during the mounting process by the curing of epoxy at a temperature of about 160 degrees celsius and/or during the soldering process at a temperature for example of about 240-260 degrees celsius.

After component mounting is complete, carrier 300 may be moved for further processing.

In the method of FIG. 4b, stiffener panel 110 may be attached to the upper surface 125a of substrate panel 125 before dies 170 are attached. In the method FIG. 4a, the stiffener panel 110 may be attached after the dies 170 are attached.

The stiffener panel 110 may be configured to provide for multiple stiffener rings 111, which may be adjacent the perimeter of each of the plurality of substrates 120. Stiffener panel 110 may not provide for a plurality of stiffener rings, as other stiffener configurations can be employed. Additionally, instead of a composite stiffener panel, a plurality of separate stiffeners could be affixed to the substrate panel 125.

Stiffener panel 110 may be affixed directly to upper surface portions 125a of substrate panel 125 by methods and using equipment known to those skilled in the art. For example, stiffener panel 110 and substrate panel 125 may be subjected to heat when an epoxy (such as for example ABLESTIK™ 8700K made by National Starch and Chemical Company) is applied between mating surfaces, and the surfaces are pressed together. Carrier 300 may provide support to stiffener panel 110 and substrate panel 125 during the mounting of stiffener panel 110 to substrate panel 125.

As illustrated in FIG. 5, stiffener panel 110 may be formed as a sheet having apertures 118 through which dies 170 can be received so as to be attached to the substrate, as described hereafter. Stiffener panel 110 is provided with longitudinal spaced slots 116a, transverse slots 116b, and corner slots 116e. Slots 116a-116c permit a plurality of central portions of the stiffener panel 110 to be detached from a perimeter frame portion of stiffener panel 110 when substrate 120 and components are separated into separate packages 100. Thus the small tab portions 152 of stiffener panel 110 may remain attached to the separated stiffener rings 111 as is shown after singulation in FIG. 9.

As will be appreciated by those skilled in the art a variety of different stiffener ring configurations could be employed in a composite form of a stiffener panel 110, depending on the particular application. Regardless of the design particulars of the stiffener element, it may be desirable to minimize the material of the stiffener ring assembly that must be cut and discarded during singulation.

Alignment of stiffener panel 110 with carrier 300 and in particular with substrate panel 125, may be accomplished by aligning apertures 134 of stiffener panel 110 with alignment pins 122 provided on carrier 300. Alignment pins 122 may thus be configured to have sufficient length to pass through the apertures 124 of the substrate panel 125 and engage the apertures 134 of the stiffener panel 110.

Apertures 134 of the stiffener panel 110 are shown slightly recessed from either end of the stiffener panel 110 to maximize the usable area. Other apertures 134 in the stiffener panel 110 are provided along the edges of the stiffener panel as depicted in FIG. 5. Alternative arrangements of apertures as part of stiffener panel 110 can be employed, provided the arrangement provides a sufficient mechanical connection for the particular application.

Stiffener panel 110 can be mounted to the substrate panel 125 using known equipment such as a automatic glue dispense and placement machine that may be commercially available. A layer of a suitable epoxy or other thermosetting plastic can be applied between the two surfaces (typically initially to the mating surface of the stiffener panel 110) to effect a permanent bond between the substrate panel 125 and the stiffener panel 110.

Stiffener panel 110 may be affixed to the upper surface 125*a* of substrate panel 125, where both have been heated to an elevated temperature such as in the range of about 150 to 170 degrees celsius, and which may be about 160 degrees celsius. The stiffener panel 110 and substrate panel 125 may have been heated to about the same elevated temperatures or too different temperatures. However, in either case, upon cooling of stiffener panel 110 and substrate panel 125, the stiffener panel which does not wish to contract as much as the substrate panel, will exert tension forces that will be applied in at least one if not both longitudinal and transverse directions. The cooling of carrier 300, substrate panel 125 and stiffener panel 110 may occur simply as a result of subjecting the combination to a relatively cool room/ambient temperature.

The bond between the stiffener panel 110 and the surface 125*a* of substrate panel 125 may be effected with an engineered epoxy, another thermosetting plastic, or other suitable adhesive. Once an epoxy reaches its activating temperature (eg. 160-200 degrees celsius) it may cure and form a permanent bond between the stiffener panel 110 and substrate panel 125.

The CTE of the epoxy material may chosen to be compatible with the overall structure, but typically will not be controlling. The substrate material and the stiffener material will typically control the interaction between the stiffener panel 110 and substrate panel 125, with little or no impact being provided by the epoxy material.

The combination of stiffener panel 110 bonded to the substrate panel 125, creates a combined panel which has an overall increased strength and rigidity and which per se, is better able to withstand the further package processing steps.

A greater enhanced beneficial may be achieved in the combination of substrate panel 125 having a given CTE, sandwiched between the stiffener panel 110 above and carrier 300 below, and each having CTEs that are lower than the CTE of the substrate panel. This effect includes an even further increase in rigidity and resistance to warping of the substrate panel 125 when subjected to further manufacturing processes, including in particular, the under-filling process.

It will, however, also be appreciated that the CTE of the stiffener panel 110 should not be so much less than the CTE of the substrate panel 110, such that when the substrate panel 110 undergoes heating (such as during under-filling), and it tries to expand, the tensile forces exerted by the stiffener panel 110 are not entirely eliminated and the substrate panel is not put into a significant degree of compression, such that buckling would occur in the substrate panel 110.

Additionally, the CTEs of the carrier 300 and stiffener panel 125 can be chosen so that it will be possible to detach the stiffener panel 110, (attached to the substrate panel 125) from the carrier.

In some embodiments, stiffener panel 110 or substrate panel 125 may also have pins receivable in mating slots of the other of stiffener panel 110 and substrate panel 125. Accordingly, the adhesive connection between the stiffener panel 110 and the substrate panel 125 may be enhanced.

Optionally a heat spreader panel 150 (FIG. 7) may be affixed on top of the stiffener panel 110. This bond may also be effected by a suitable epoxy, thermosetting plastic, or other suitable adhesive. The material of the heat spreader may be selected so that in addition to fulfilling the function of conducting and dissipating heat energy, the CTE is also very close in magnitude or the same as the CTE of the stiffener panel 110. In this way, the heat spreader panel 150 will not interfere with the desired interaction between the stiffener panel 110 and the substrate panel 125.

In the method illustrated in FIG. 4B, once stiffener panel 110 is attached, a plurality of integrated circuit, dies 170 may be attached to the upper surface of substrate panel 125. In the method of FIG. 4*a*, the stiffener panel 110 is attached after dies 170 are attached.

Dies 170 may include large-scale integrated circuits embedded in the die. Dies 170 may, for example, be specialized purpose integrated circuits, such as micro processors, graphics processors, or the like. Dies 170 may be attached to substrate 120 in a generally central position, through each of the multiple spaced central apertures 118 formed in the stiffener panel 110. Although only four specific apertures 118 in stiffener panel 110 are illustrated in FIG. 5, dies 170 may be placed on the substrate panel 125 through any number of apertures 118 formed in the stiffener panel 110.

Dies 170 may be each attached to the upper surface 125*a* of substrate panel 125 and electrically coupled to a connection portion on surface 125*a*. The physical attachment and electrical coupling may be carried out in any of the ways known to persons skilled in the art.

Once dies 170 have been attached various known processing steps may be undertaken to ensure adequate mechanical and electrical interconnection between the dies 170 and the substrate panel 125.

For example, if die 170 is a flip chip it may be required to undergo die under-fill as in step 242, as described above.

Subsequently, the substrate panel 125 with stiffener panel 110 and passive components attached thereto, can be removed from carrier 300, as set out in step 246. Consequently, carrier 300 may be reusable as contrasted with conventional methods in which the carrier strip is either damaged or incorporated into the packaged device. The ability to reuse carrier 300 is advantageous and may decrease variable manufacturing costs.

Carrier 300 may be physically detached by heating up the substrate and the carrier to about 60 to 90 celsius and then separate using a specially designed fixture or automatic machine.

Once carrier 300 has been detached, the combination of substrate panel 110 etc. can be further processed such as for example to provide for external device connection capability. For example, in FIGS. 4A and 4B, in step 244, ball mount and re-flow steps to form a ball grid array, can be performed.

Additionally various branding/and or marking can be applied to the substrate panel 125, dies 170, stiffener panel 110 and/or other mounted components such that each individual semiconductor chip package will have been marked and/or branded such as with trade marks, trade names, product identification numbers, serial nos. etc. The marking and/or branding can be carried out using processes and equipment known to those skilled in the art.

Specific processing steps may vary depending on the particular chip and packaging technology and application.

Once carrier 300 is removed from the substrate panel 125, the composite structure is then moved to station 1260 where the substrate panel 125, and attached stiffener panel 110 is singulated.

The process of and apparatus used in singulation are known to persons skilled in the art and can be readily adapted by persons skilled in the art to separate the combined substrate panel 125 and stiffener panel 110 into individual packaged integrated circuit chips. Examples of suitable equipment that may be employed for singulation include use of a saw machine and laser cutting systems.

During singulation, the substrate panel 125 and stiffener panel 110 will be cut along the lines aligned with slots 116a-116c so as to separate the strips into separate integrated circuit chip packages.

Figure 9:
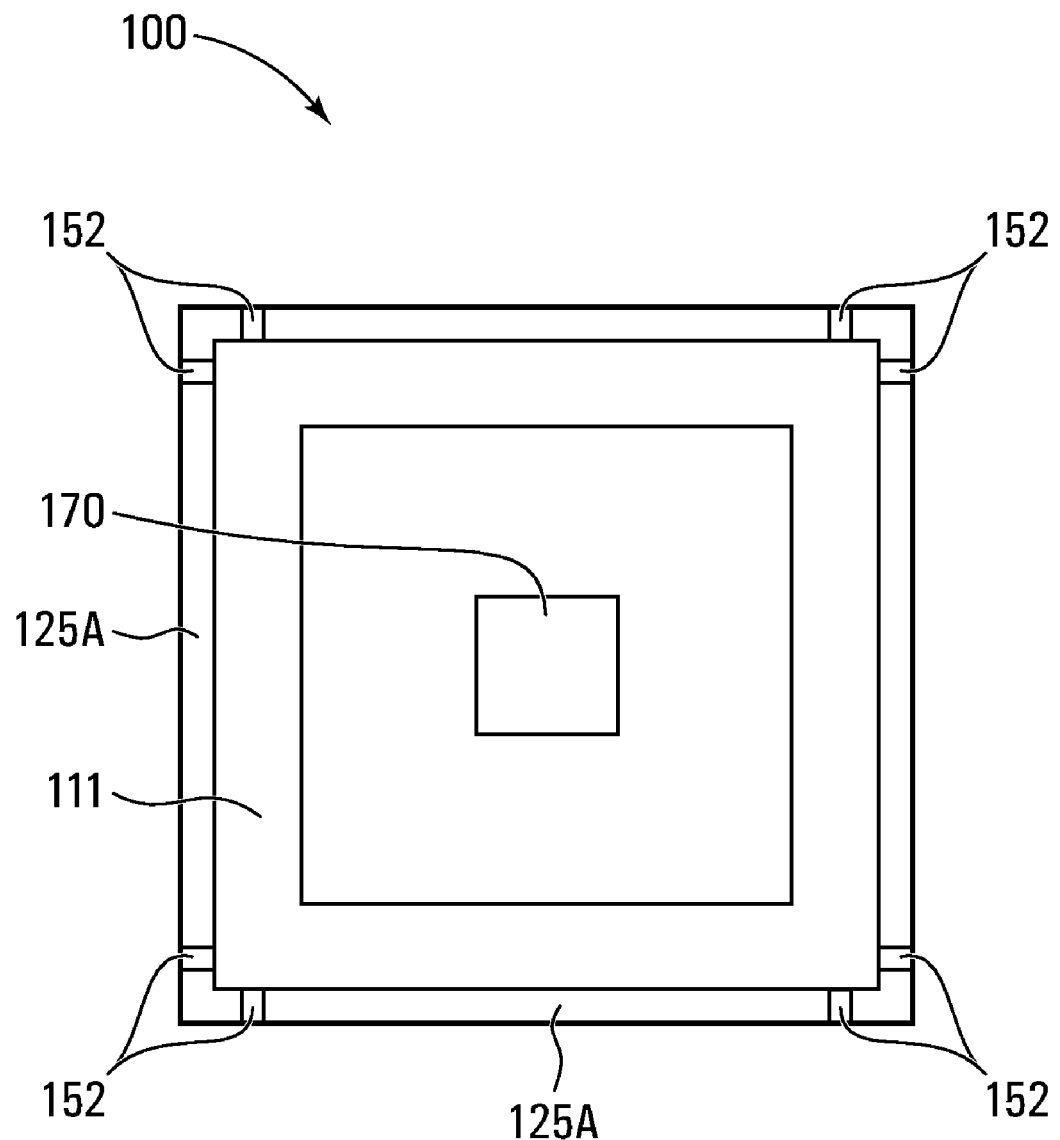
FIG. 9 is a plan view of a singulated semiconductor chip package that includes a die, substrate, and stiffener ring.

A plan view of a singulated package 100 is illustrated in FIG. 9, overlaid on a singulated portion of substrate panel 125. Die 170 is attached to the substrate portion 125a in the aperture 118 of the stiffener panel 110. In the preferred embodiment the die 170 is centered on the singulated substrate portion 125a, for among other reasons, to provide a relatively uniform heat distribution profile.

The design of stiffener panel 110 may efficiently utilize the substrate panel 125 to minimize costs and maximize the number of packaged devices 100 produced. As illustrated in FIG. 9, only tabs 152 of the singulated portion of the stiffener panel 110 extend to the edges of the singulated substrate portion 125a. This may result in a reduced amount of waste substrate material and this may reduce manufacturing costs.

In some alternate embodiments, singulation may take place when the substrate panel 125 is attached to carrier 300. The presence of carrier 300 may assist in the singulation process, by providing a base upon which to cut the combined substrate panel, stiffener panel with attached components. However, typically the bottom surface of the substrate panel 125 will require processing and so the carrier will have to be detached to carry out the same. Therefore, the substrate would have to reattached the carrier to perform singulation which may not be desirable. In general, the appropriate sequence can be selected for a given application.

As used herein, the term "including" means "including without limitation" and is not to be construed to limit any general statement which it follows to the specific or similar items or matters immediately following it.

It will be further understood that the invention is not limited to the embodiments described and shown herein, which are deemed to be merely illustrative of the best modes of carrying out the invention, and which are susceptible to modification or form, size, arrangement of parts and details of operation. The invention, rather, is intended to encompass all such modifications which are within its spirit and scope as defined by the claims.

Of course, the above described embodiments, are intended to be illustrative only and in no way limiting. The described embodiments of carrying out the invention, are susceptible to many modifications of form, arrangement of parts, details and order of operation. The invention, rather, is intended to encompass all such modification within its scope, as defined by the claims.

What is claimed is:

1. A method of forming a plurality of semiconductor chip packages, said method comprising:
   a) providing a substrate panel to be singulated into substrates each for an individual one of said plurality of semiconductor chip packages, said substrate panel having a first coefficient of thermal expansion (CTE);
   b) providing a carrier for supporting said substrate panel, as components are mounted thereto, said carrier having a second CTE that is less than said first CTE;
   c) heating said substrate panel and said carrier to first and second elevated temperatures respectively;
   d) mounting said substrate panel at about said first elevated temperature to said carrier, said carrier being at about said second elevated temperature, to provide a connection between said carrier and said substrate panel;
   e) cooling said carrier and said substrate panel from said first and second elevated temperatures thereby putting said substrate panel into tension in at least one direction; and
   f) detaching said carrier from said substrate panel.

2. A method as claimed in claim 1 wherein said first and second elevated temperatures are substantially the same.

3. A method as claimed in claim 1 wherein said connection between said carrier and said substrate panel is a mechanical connection such that when said carrier and said substrate panel cool, the carrier will exert tensile forces upon said substrate panel in said at least one of a longitudinal direction and a transverse direction.

4. A method as claimed in claim 3 wherein said mechanical connection comprises one of said carrier and said substrate panel comprising a plurality of protrusions adapted to be received in a corresponding plurality of slots in the other of said carrier and said substrate panel, such that said substrate panel is put into tension in at least one of a longitudinal direction and a transverse direction by the forces exerted by said protrusions received in said slots of said substrate panel.

5. A method as claimed in claim 4 wherein said protrusions are on said carrier and said slots are in said substrate panel.

6. A method as claimed in claim 4 wherein said protrusions and said slots are configured to permit expansion of said substrate panel without said protrusions putting said substrate panel into compression, when said carrier is heated above said first elevated temperature and said substrate panel is heated above said second elevated temperature.

7. A method as claimed in claim 1 wherein said connection is operable to permit expansion of said substrate panel without putting said substrate panel into compression, when said carrier is heated above said first elevated temperature and said substrate panel is heated above said second elevated temperature.

8. A method as claimed in claim 1 further comprising after (c),
   g) mounting and electrically connecting a plurality of dies to said substrate panel.

9. A method as claimed in claim 8 wherein said mounting and electrically connecting comprises re-flowing a plurality of solder bumps.

10. A method as claimed in claim 8, further comprising, after (d),
    h) under-filling said plurality of dies.

11. A method as claimed in claim 10 further comprising after (d) but prior to (e),
    i) affixing a stiffener panel to said substrate panel such that said substrate panel is positioned between said carrier and said stiffener panel.

12. A method as claimed in claim 10, further comprising after (f),
    j) singulating said substrate panel, said plurality of dies and said stiffener panel into said plurality of semiconductor chip packages each having at least one of said plurality of dies.

13. A method as claimed in claim 1 wherein said substrate panel is made with a thin core.

14. A method as claimed in claim 1 wherein said substrate panel is made without a core.

15. A method as claimed in claim 7 wherein said substrate panel is made with a thin core or without a core.

16. A method as claimed in claim 11 wherein said substrate panel is made with a thin core or without a core.

17. A method of forming a plurality of semiconductor chip packages comprising:

a) providing a substrate panel suitable to be singulated into substrates, each for one of said plurality of semiconductor chip packages;

b) supporting said substrate panel under tension on a substantially rigid carrier beneath said substrate panel, as components are mounted thereto;

c) affixing a stiffener panel to said substrate panel when said stiffener panel is heated to a first elevated temperature and said substrate panel is heated to a second elevated temperature, such that said substrate panel is positioned between said carrier and said stiffener panel;

d) mounting and electrically connecting a plurality of dies to said substrate panel; and e) under-filling said plurality of dies with said stiffener panel affixed to said substrate panel; and f) detaching said carrier from said substrate panel.

18. A method as claimed in claim 17 wherein (c) occurs after (d).

19. A method as claimed in claim 17 wherein (c) occurs prior to (d).

20. A method as claimed in claim 17, further comprising after (f), (g) singulating said substrate panel, said plurality of dies and said stiffener panel into said plurality of semiconductor chip packages each having at least one of said plurality of dies.

21. A method of packaging a plurality of semiconductor chips comprising:

a) providing a substrate panel having a first coefficient of thermal expansion (CTE);

b) placing said substrate panel under tension on a carrier that supports said substrate as components are mounted thereto;

c) providing a stiffener panel comprising a plurality of stiffeners, said stiffener panel having a second CTE that is less than said first CTE;

d) affixing said stiffener panel to said substrate panel when said stiffener panel is at a first elevated temperature and said substrate panel is at a second elevated temperature;

e) cooling said substrate panel and said stiffener panel from said second and first elevated temperatures respectively, to place said substrate panel in tension in at least one direction;

f) detaching said carrier from said substrate panel; and g) singulating said substrate panel and said stiffener panel into a plurality of semiconductor chip packages.

22. A method as claimed in claim 21 wherein said first elevated temperature is substantially the same as said second elevated temperature.

23. A method as claimed in claim 21 wherein said substrate panel is positioned between said carrier and said stiffener panel.

24. A method as claimed in claim 23 wherein said carrier has a third CTE that is less than said first CTE.

25. A method as claimed in claim 24 wherein said second CTE is substantially equal to said third CTE.

26. A method as claimed in claim 25 wherein said carrier is mechanically connected to said substrate panel with both said carrier and said substrate panel being heated to about a common third elevated temperature, such that when said carrier and said substrate panel are cooled, the carrier will exert tensile forces upon said substrate panel in said at least one of a longitudinal direction and a transverse direction.

27. A method as claimed in claim 26 wherein said carrier and said stiffener panel are exerting tensile forces on opposite surfaces of said substrate, tending to reduce the likelihood of said substrate panel warping.

28. A method as claimed in claim 21 wherein said stiffener panel is affixed to said substrate panel with a thermosetting adhesive having an activating temperature, and wherein said thermosetting adhesive is heated to said activating temperature so as to create a thermally resistant bond between said substrate panel and said stiffener panel.

29. A method as claimed in claim 21 further comprising prior to d), h) mounting and electrically connecting a plurality of dies to said substrate panel.

30. A method as claimed in claim 29 wherein said mounting and electrically connecting comprises re-flowing a plurality of solder bumps.

31. A method as claimed in claim 29, further comprising, after (d), i) under-filling said plurality of dies.

32. A method as claimed in claim 24 wherein said first CTE, said second CTE said third CTE are inter-related such that when said carrier, said substrate panel and said stiffener panel are at a room temperature, said carrier and said stiffener panel exert tensile forces upon said substrate panel.

33. A method as claimed in claim 21 wherein said substrate panel is made with a thin core.

34. A method as claimed in claim 21 wherein said substrate panel is made without a core.

35. A method as claimed in claim 26 wherein said substrate panel is made with a thin core or without a core.

36. A method as claimed in claim 31 wherein said substrate panel is made with a thin core or without a core.

* * * * *